United States Patent
Kim et al.

(10) Patent No.: US 10,103,180 B2
(45) Date of Patent: Oct. 16, 2018

(54) CRYSTALLIZATION APPARATUS, CRYSTALLIZING METHOD, AND METHOD OF MANUFACTURING ORGANIC LIGHT-EMITTING DISPLAY APPARATUS

(71) Applicant: Samsung Display Co., Ltd., Yongin, Gyeonggi-do (KR)

(72) Inventors: Tae-Yong Kim, Yongin (KR); Joon-Hyung Kim, Yongin (KR); Je-Kil Ryu, Yongin (KR); Sung-Gon Kim, Yongin (KR); Pil-Kyu Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 1408 days.

(21) Appl. No.: 13/627,094

(22) Filed: Sep. 26, 2012

(65) Prior Publication Data

US 2013/0137204 A1    May 30, 2013

(30) Foreign Application Priority Data

Nov. 24, 2011 (KR) .................. 10-2011-0123663

(51) Int. Cl.
| | |
|---|---|
| *H01L 27/12* | (2006.01) |
| *B23K 26/082* | (2014.01) |
| *H01L 51/56* | (2006.01) |
| *H01L 27/32* | (2006.01) |
| *B23K 101/40* | (2006.01) |

(52) U.S. Cl.
CPC ........ *H01L 27/1285* (2013.01); *B23K 26/082* (2015.10); *B23K 2201/40* (2013.01); *H01L 27/3262* (2013.01); *H01L 51/56* (2013.01)

(58) Field of Classification Search
CPC combination set(s) only.
See application file for complete search history.

(56) References Cited

U.S. PATENT DOCUMENTS

| | | | |
|---|---|---|---|
| 8,797,328 B2 | 8/2014 | Kwak et al. | |
| 2005/0040146 A1* | 2/2005 | Takami | B23K 26/03 219/121.63 |
| 2005/0237895 A1* | 10/2005 | Tanaka | B23K 26/0738 369/97 |
| 2005/0282364 A1 | 12/2005 | Seki et al. | |

(Continued)

FOREIGN PATENT DOCUMENTS

| | | |
|---|---|---|
| KR | 10-2005-0081610 | 8/2005 |
| KR | 10-2006-0048396 | 5/2006 |

(Continued)

*Primary Examiner* — Erin F Bergner
(74) *Attorney, Agent, or Firm* — Knobbe Martens Olson & Bear LLP

(57) ABSTRACT

A crystallization apparatus for crystallizing a semiconductor layer formed on a substrate. The crystallization apparatus includes a laser generator, which generates a laser beam, an optical device for changing a path of the laser beam emitted from the laser generating device, and a stage on which the substrate is arranged, wherein the optical device changes the path of the laser beam by rotating with respect to a constant axis, and the stage is moved so that the laser beam having the changed path is irradiated to a constant region on the semiconductor layer.

14 Claims, 8 Drawing Sheets

(56) References Cited

U.S. PATENT DOCUMENTS

| | | | | |
|---|---|---|---|---|
| 2006/0267885 | A1* | 11/2006 | Kwak | G09G 3/3233 |
| | | | | 345/76 |
| 2008/0210671 | A1* | 9/2008 | Jennings | B23K 26/0613 |
| | | | | 219/121.61 |
| 2009/0001523 | A1* | 1/2009 | Im | H01L 21/02422 |
| | | | | 257/627 |
| 2009/0314755 | A1 | 12/2009 | Chung | |
| 2011/0008973 | A1 | 1/2011 | Kawaguchi et al. | |
| 2014/0045347 | A1 | 2/2014 | Im | |

FOREIGN PATENT DOCUMENTS

| | | |
|---|---|---|
| KR | 10-2006-0117119 | 11/2006 |
| KR | 10-2008-0086880 | 9/2008 |
| KR | 10-2008-0109788 | 12/2008 |
| KR | 10-2009-0131551 | 12/2009 |
| KR | 10-2010-0093560 | 8/2010 |

* cited by examiner

CRYSTALLIZATION APPARATUS, CRYSTALLIZING METHOD, AND METHOD OF MANUFACTURING ORGANIC LIGHT-EMITTING DISPLAY APPARATUS

CROSS-REFERENCE TO RELATED APPLICATIONS

This application claims the benefit of Korean Patent Application No. 10-2011-0123663, filed on Nov. 24, 2011, in the Korean Intellectual Property Office, the disclosure of which is incorporated herein in its entirety by reference.

BACKGROUND

Field

The described technology generally relates to a crystallization apparatus, a crystallizing method, and a method of manufacturing an organic light-emitting display apparatus.

Description of the Related Technology

An active matrix (AM) type organic light-emitting display apparatus includes a pixel driving circuit in each pixel, and the pixel driving circuit includes a thin film transistor (TFT) formed of silicon. The silicon forming the TFT generally includes amorphous silicon or polycrystalline silicon.

An amorphous silicon TFT (a-Si TFT) used in the pixel driving circuit has a structure in which a semiconductor active layer forming a source, a drain, and a channel is formed of amorphous silicon, and thus, has a low electron mobility equal to or less than 1 $cm^2/Vs$. Accordingly, recently, a polycrystalline silicon TFT (poly-Si TFT) has been used instead of a-Si TFT. The poly-Si TFT has a higher electron mobility than that of the a-Si TFT, and has an excellent stability with respect to irradiated light. Thus, the poly-Si TFT is very appropriate to be used as an active layer of a driving and/or switching TFT of the AM type organic light-emitting display apparatus.

The poly-Si TFT may be manufactured by one of various methods, which may be broadly divided into a method of directly depositing polycrystalline silicon, and a method of depositing and crystallizing polycrystalline silicon.

Examples of the method of directly depositing polycrystalline silicon include chemical vapor deposition (CVD), photo CVD, hydrogen radical (HR) CVD, electron cyclotron resonance (ECR) CVD, plasma-enhanced (PE) CVD, low pressure (LP) CVD, and the like.

Examples of the method of depositing and crystallizing polycrystalline silicon include solid phase crystallization (SPC), excimer laser crystallization (ELC), metal-induced crystallization (MIC), metal-induced lateral crystallization (MILC), sequential lateral solidification (SLS), and the like.

SUMMARY OF CERTAIN INVENTIVE ASPECTS

An aspect provides a crystallization apparatus, a crystallizing method, and a method of manufacturing an organic light-emitting display apparatus, whereby a partial region on a substrate may be selectively crystallized, and the uniformity of a crystallization region may be improved.

According to one aspect, there is provided a crystallization apparatus for crystallizing a semiconductor layer formed on a substrate, the crystallization apparatus including a laser generator, which generates a laser beam, an optical device adapted to change a path of the laser beam emitted from the laser generating device, and a stage on which the substrate is arranged, where the optical device is adapted to change the path of the laser beam by rotating with respect to a constant axis, and where the stage is moved so that the laser beam having the changed path is irradiated to a constant region on the semiconductor layer.

The laser beam can be a line beam having a predetermined width.

An angular velocity of the optical device and a movement velocity of the stage can be synchronized with each other.

The laser beam can be incident to the optical device that rotates, thus, an incidence angle of the laser beam can be changed, the laser beam can be refracted in the optical device, and an exit angle of the laser beam can be changed, whereby the path of the laser beam can be changed.

The laser beam that reaches the semiconductor layer via the optical device can be irradiated to the constant region on the semiconductor layer.

An incidence angle of the laser beam that is incident to the optical device can be the same as an exit angle of the laser beam that is emitted from the optical device.

The optical device can have a rectangular parallelepiped form.

The optical device can alternately rotate.

The optical device can have a cube form.

The optical device can rotate at a constant velocity.

The laser beam generated by the laser generator can be a pulse laser.

An n-th path in which an n-th pulse of the pulse laser is incident to and is emitted from the optical device can be different from an n+1-th path in which an n+1-th pulse of the pulse laser is incident to and is emitted from the optical device.

The stage can be moved such that a region on the semiconductor layer to which the n-th pulse reaches can be the same as a region on the semiconductor layer to which the n+1-th pulse reaches.

A pulse period of the pulse laser, an angular velocity of the optical device, and a movement velocity of the stage can be synchronized such that the pulse laser is irradiated to regions of the semiconductor layer to be crystallized.

The optical device can rotate at a constant velocity and the stage can linearly move at a constant velocity during the pulse period of the pulse laser.

According to another aspect, there is provided a crystallizing method including operations of arranging a substrate on a stage, where a semiconductor layer is formed on one surface of the substrate, irradiating a first laser beam through an optical device, irradiating the first laser beam passing through the optical device to a region of the semiconductor layer to perform crystallization, changing the position of the optical device by rotation in order to change a path of the first laser beam, irradiating the first laser beam with the changed path to the optical device of with a changed position, and moving the stage such that the laser beam of with the changed path is irradiated to the region of the semiconductor layer to which the first laser beam has been irradiated.

The laser beam can be a line beam having a predetermined width.

An angular velocity of the optical device and a movement velocity of the stage can be synchronized with each other.

An incidence angle of the laser beam that is incident to the optical device can be the same as an exit angle of the laser beam that is emitted from the optical device.

The optical device can have a rectangular parallelepiped form.

The optical device can alternately rotate.

The optical device can have a cube form.

The optical device can rotate at a constant velocity.

The laser beam generated by the laser generator can be a pulse laser.

An n-th path in which an n-th pulse of the pulse laser is incident to and is emitted from the optical device can be different from an n+1-th path in which an n+1-th pulse of the pulse laser is incident to and is emitted from the optical device.

The stage can be moved such that a region on the semiconductor layer to which the n-th pulse reaches can be the same as a region on the semiconductor layer to which the n+1-th pulse reaches.

A pulse period of the pulse laser, an angular velocity of the optical device, and a movement velocity of the stage can be synchronized so that the pulse laser is irradiated to regions of the semiconductor layer which are required to be crystallized.

According to another aspect, there is provided a method of manufacturing an organic light-emitting display apparatus, the method including the crystallizing method, where the organic light-emitting display apparatus includes a plurality of pixels having channel regions, storage regions, and emission regions, respectively, and the operation of performing the crystallization includes an operation of crystallizing only the channel regions and the storage regions.

BRIEF DESCRIPTION OF THE DRAWINGS

The above and other features and advantages will become more apparent by describing in detail certain embodiments with reference to the attached drawings in which.

DETAILED DESCRIPTION OF CERTAIN INVENTIVE EMBODIMENTS

The present invention will now be described more fully with reference to the accompanying drawings, in which certain embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art.

Figure 1:
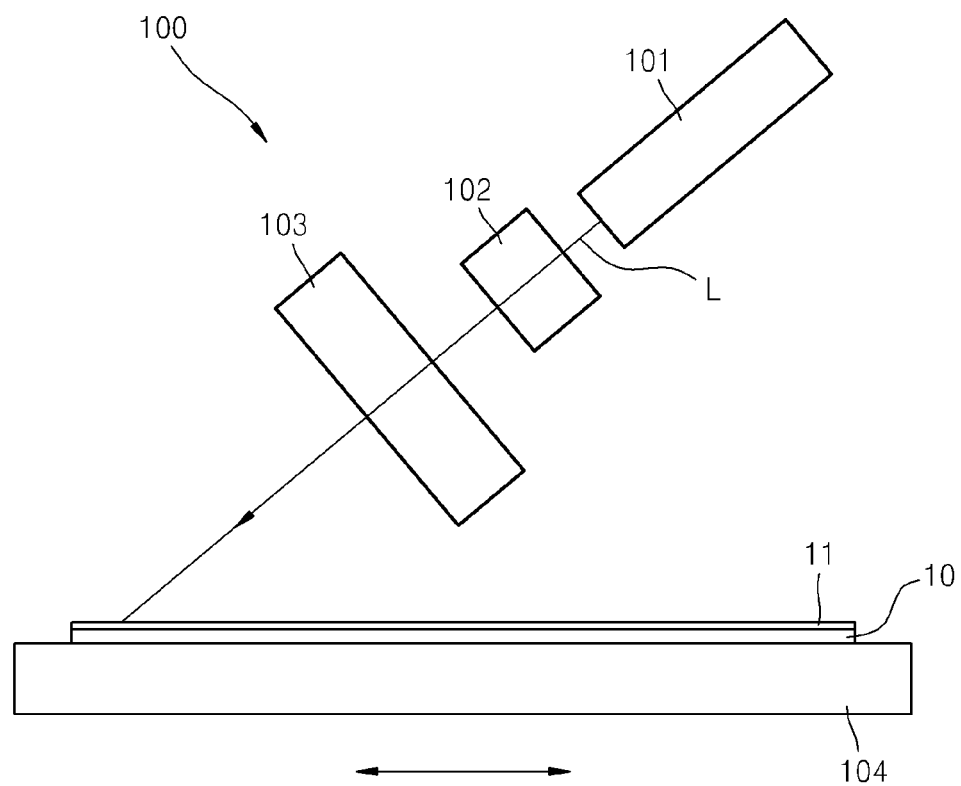
FIG. 1 is a diagram schematically illustrating an embodiment of a crystallization apparatus.

FIG. 1 is a diagram schematically illustrating an embodiment of a crystallization apparatus 100.

Referring to FIG. 1, the crystallization apparatus 100 can include a laser generating device 101 for generating a laser beam L, an optical system 102 for processing the laser beam L emitted from the laser generating device 101, an optical device 103 for changing a path of the laser beam L, and a stage 104 on which a substrate 10 is arranged.

In some embodiments, the optical system 102 can include an attenuator (not shown) for adjusting an amount of energy of the laser beam L that is emitted from the laser generating device 101 and is not processed, a focusing lens (not shown) for focusing the laser beam L that is emitted from the laser generating device 101, and a reduction lens (not shown) for reducing the laser beam L, which has passed through the focusing lens, by a predetermined rate.

The stage 104 may be positioned to correspond to the laser generating device 101. The substrate 10 is arranged on the stage 104. A semiconductor layer 11, that is an amorphous silicon layer, is deposited on the substrate 10. In some embodiments, in order to crystallize a predetermined region of the substrate 10, the stage 104 can be moved.

Hereinafter, a configuration of an organic light-emitting display apparatus that is manufactured using the crystallization apparatus 100 will be described in detail.

Figure 2:
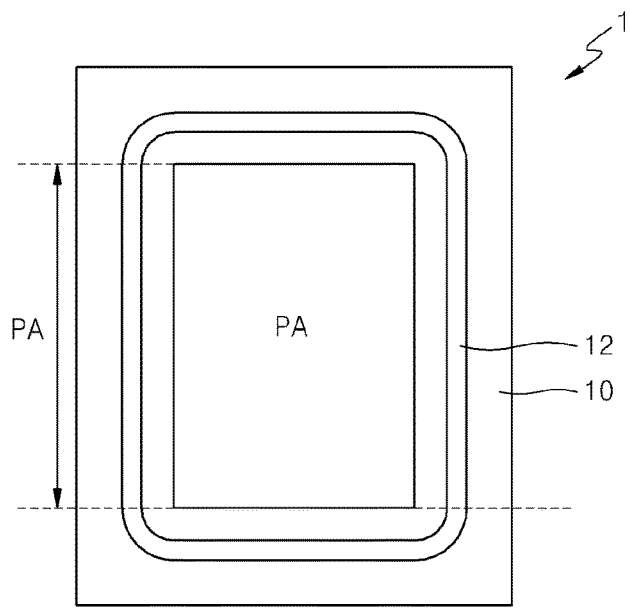
FIG. 2 is a plane view schematically illustrating an embodiment of an organic light-emitting display apparatus manufactured by using an embodiment of the crystallization apparatus of FIG. 1.
Figure 3:
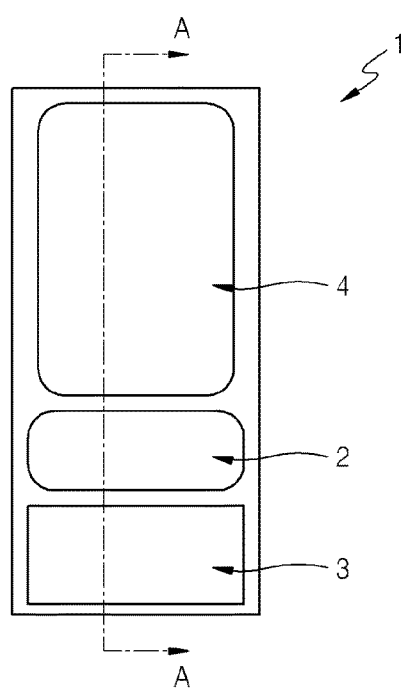
FIG. 3 is a plane view of an embodiment of a pixel constituting the organic light-emitting display apparatus of FIG. 2.
Figure 4:
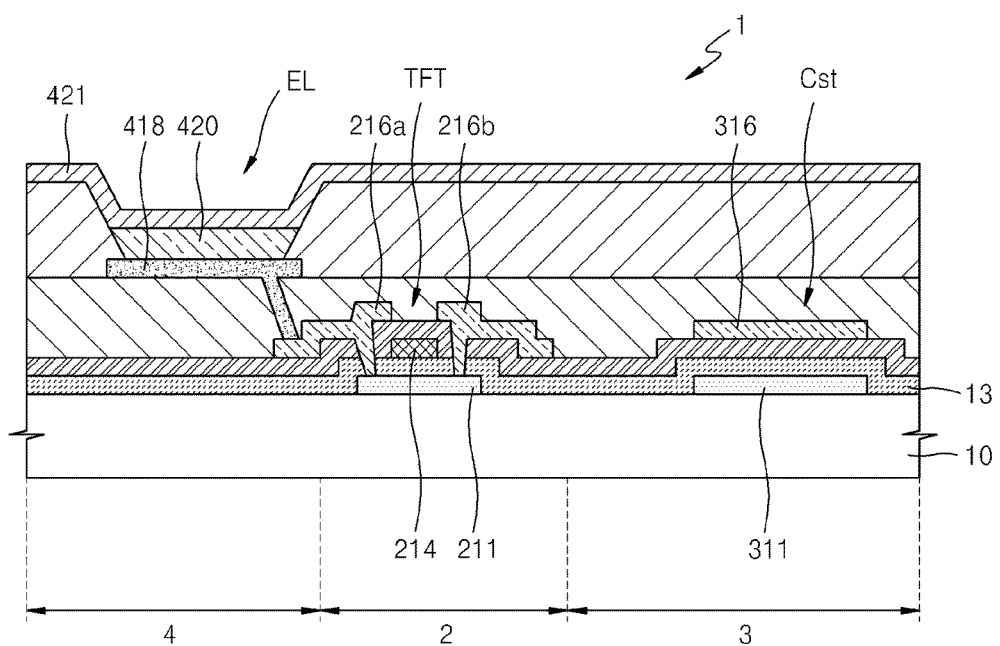
FIG. 4 is a cross-sectional view of the pixel of FIG. 3, taken along line A-A'.

FIG. 2 is a plane view schematically illustrating an embodiment of an organic light-emitting display apparatus 1 that is manufactured by using an embodiment of the crystallization apparatus 100 of FIG. 1, FIG. 3 is a plane view of an embodiment of a pixel constituting the organic light-emitting display apparatus 1 of FIG. 2, and FIG. 4 is a cross-sectional view of the pixel of FIG. 3, taken along line A-A'.

Referring to FIG. 2, the organic light-emitting display apparatus 1 includes a first substrate 10 including a thin film transistor (TFT), an organic electroluminescent (EL) device, and the like, and a second substrate (not shown) bonded with the first substrate 10 by a sealing method.

On the first substrate 10, a plurality of pixels, each including a TFT, an organic EL device, a storage capacitor Cst, and the like, can be formed. The first substrate 10 can be a low-temperature polycrystalline silicon (LTPS) substrate, a glass substrate, a plastic substrate, a stainless using steel (SUS) substrate, or the like.

The second substrate can be an encapsulation substrate that is disposed on the first substrate 10 so as to block the TFT and the organic EL device, which are formed on the first substrate 10, from exterior moisture, air, or the like. The second substrate is positioned to face the first substrate 10, and then the first substrate 10 and the second substrate are bonded to each other by using a sealing member 12 disposed along an edge thereof. The second substrate can be a transparent glass substrate or a plastic substrate.

The first substrate 10 includes a pixel region PA and a circuit region (not shown) outside the pixel region PA. According to one or more embodiments, the sealing member 12 is disposed in the circuit region that is outside the pixel region PA, thereby bonding the first substrate 10 and the second substrate.

In some embodiments, the organic light-emitting display apparatus 1 is characterized by a feature where selective crystallization is performed in a semiconductor layer of the pixel region PA. The selective crystallization will be described in detail below.

Referring to FIGS. 3 and 4, the pixel of the organic light-emitting display apparatus 1 includes a channel region 2, a storage region 3, and an emission region 4. In some embodiments, referring to FIG. 3, the pixel has a structure in which the channel region 2, the storage region 3, and the emission region 4 are arranged along one direction. In other embodiments, the storage region 3 and the emission region 4 can be arranged in a longitudinal direction so as to neighbor each other, and the channel region 2 can be formed in one side so as to neighbor each of the storage region 3 and the emission region 4. A semiconductor layer 11 (see FIG. 1) that corresponds to the channel region 2 and the storage region 3 is crystallized, and the semiconductor layer 11 that corresponds to the emission region 4 is not crystallized. In some embodiments, the semiconductor layer 11 is selectively crystallized, and after the selective crystallization, the semiconductor layer 11 that corresponds to the emission region 4 can be removed. The selective crystallization will be described below.

Referring to FIG. 4, the TFT, as a driving device, is arranged in the channel region 2. The TFT is formed of an active layer 211, a gate electrode 214, and source/drain electrodes 216a/216b. A first insulating layer 13 is interposed between the gate electrode 214 and the active layer 211 so as to insulate the gate electrode 214 from the active layer 211. Also, source/drain regions to which high density impurities are injected are formed at both sides of the active layer 211, and the source/drain regions are connected to the source/drain electrodes 216a/216b, respectively.

The storage capacitor Cst is arranged in the storage region 3. The storage capacitor Cst includes a first capacitor electrode 311 and a second capacitor electrode 316, and the first insulating layer 13 is interposed between the first capacitor electrode 311 and the second capacitor electrode 316. In some embodiments, the active layer 211 of the TFT can be formed from the same material layer as the first capacitor electrode 311. The second capacitor electrode 316 of the storage capacitor Cst and the source/drain electrodes 216a/216b of the TFT can be formed from the same material layer.

The organic EL device is arranged in the emission region 4. The organic EL device includes a pixel electrode 418 that is connected to one of the source/drain electrodes 216a/216b of the TFT, an opposite electrode 421 facing the pixel electrode 418, and an intermediate layer 420 interposed between the pixel electrode 418 and the opposite electrode 421. The pixel electrode 418 can be formed of a transparent conductive material.

According to some methods, an entire region of a pixel region, such as for example, all of a channel region, a storage region, and an emission region, may be crystallized. However, as an organic light-emitting display apparatus becomes large, an area to be crystallized also becomes large, which increases maintenance costs involved in the generation of a laser by a laser generating device, and thus decreases productivity.

A region that requires high electron mobility in one pixel is only the channel region 2 and the storage region 3, and the emission region 4 that occupies more than half of an entire region of the pixel does not require high electron mobility. Thus, to crystallize only the channel region 2 and the storage region 3 is highly recommended in terms of the maintenance costs involved in the generation of a laser.

In some existing methods, a crystallizing method may crystallize an entire substrate by irradiating laser beams having uniform widths in such a way that the laser beams partially overlap with each other. With such methods, some regions are irradiated by the laser beams that partially overlap with each other. In these regions, sizes of crystals are not uniform and an electrical characteristic is not constant. Also, a boundary line that occurs due to the overlapped laser beams is recognized as a stain by a user.

In some embodiments, the organic light-emitting display apparatus 1 is characterized by a feature where a polycrystalline silicon active layer is formed by selectively crystallizing only the semiconductor layer 11 to be formed as the channel region 2 and the storage region 3, and by not performing crystallization on the semiconductor layer 11 to be formed as the emission region 4. While a substrate and a laser generating device are relatively moved with respect to each other, if the substrate or the laser generating device passes a portion to be crystallized, such as for example, the channel region 2 and the storage region 3, crystallization is performed. In this manner, by performing the selective crystallization, an efficiency of the laser generating device can be maximized, maintenance costs can be reduced, and productivity can be improved.

Also, in embodiments of the organic light-emitting display apparatus 1, a laser beam is irradiated to a crystallization region to be selectively crystallized while the laser beam completely overlaps with a next laser beam, so that the uniformity of the crystallization region can be improved, and it is possible to prevent a boundary line from occurring in the crystallization region.

The selective crystallization can be performed by the crystallization apparatus 100 shown in FIG. 1. Although a path of a laser beam generated by one laser generating device (refer to the laser generating device 101 of FIG. 1) is changed by the optical device 103, the stage 104 is moved so that the laser beam having the changed path is repeatedly irradiated to the channel region 2 and the storage region 3 of a first panel of a substrate (refer to the substrate 10 of FIG. 1), and the stage 104 is also moved so that the laser beam is not irradiated to the emission region 4 of the first panel.

This movement will now be described in detail.

Figure 5:
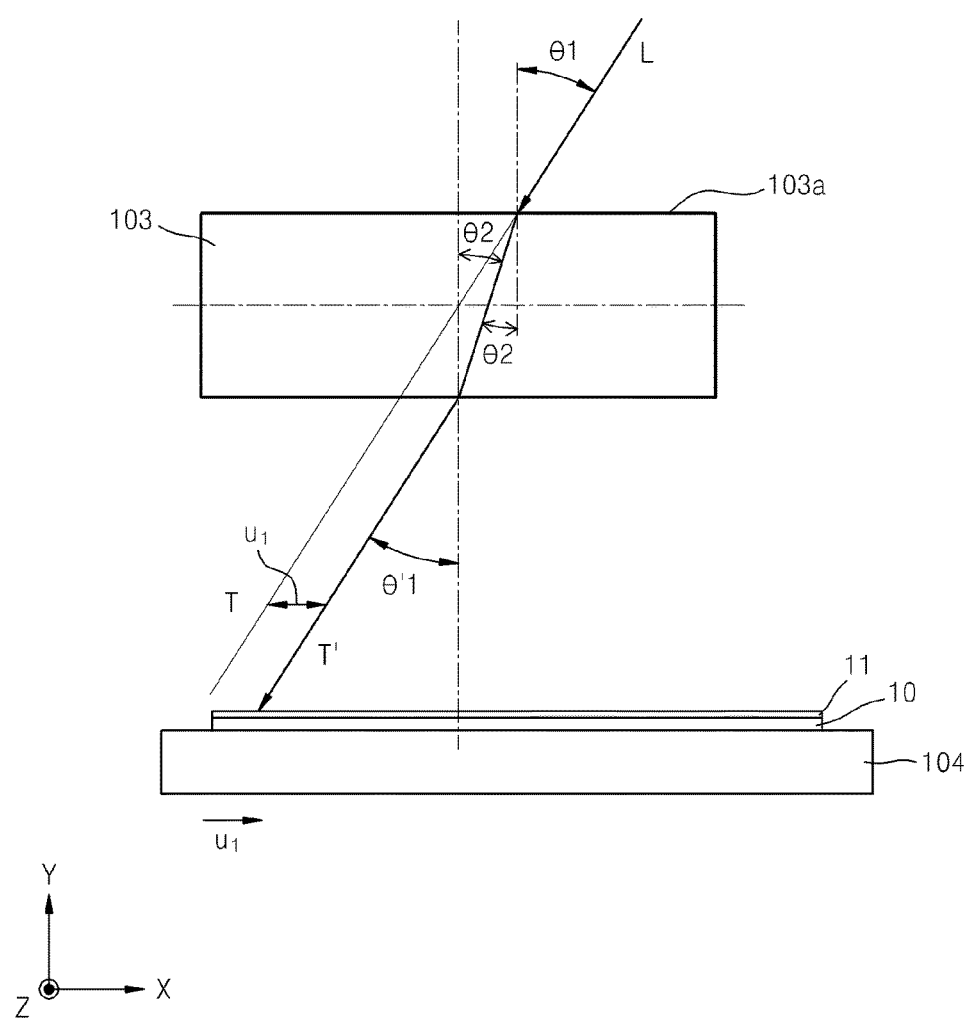
FIGS. 5 through 7 respectively illustrate each of the operational states of an optical device and a stage that are shown in FIG. 1.
Figure 6:
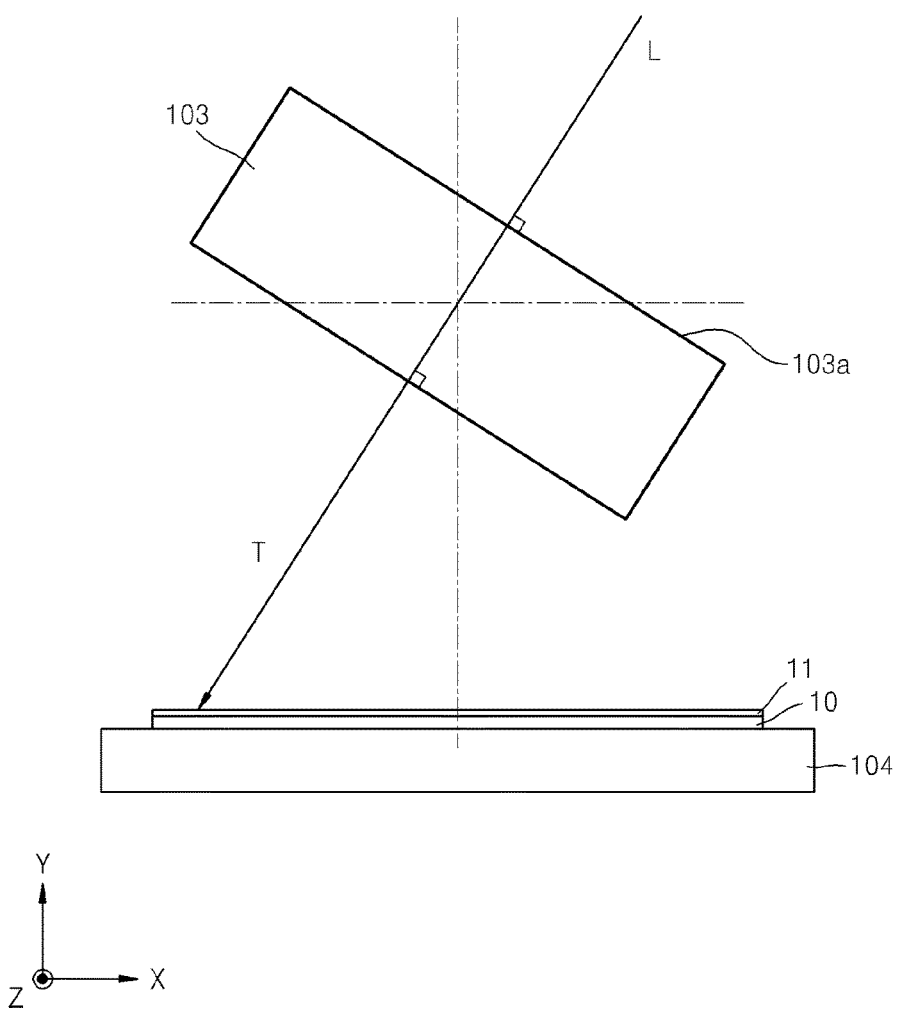
Figure 7:
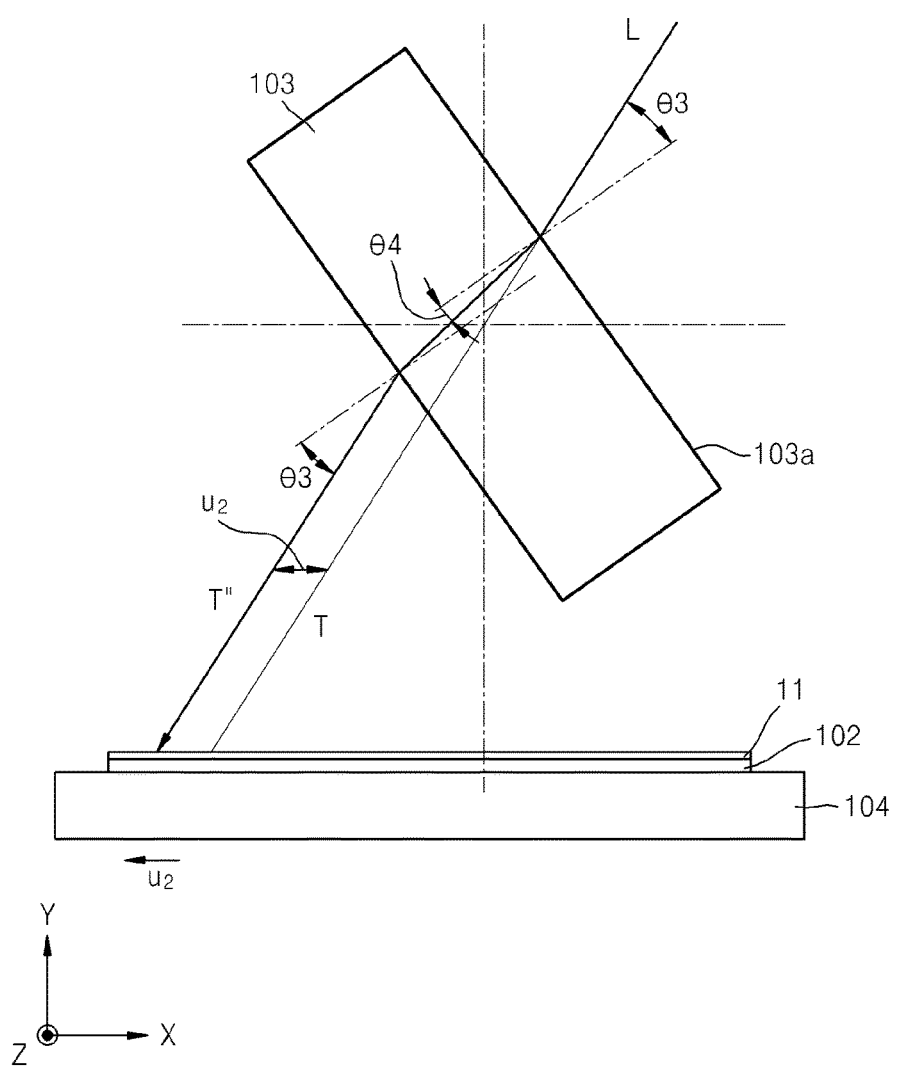

FIGS. 5 through 7 respectively illustrate each of the operational states of the optical device 103 and the stage 104 that are shown in FIG. 1.

Referring to FIGS. 5 through 7, the optical device 103 can have a rectangular parallelepiped form, and its cross-section with respect to an XY plane can have a rectangular form. In other embodiments, the optical device 103 can have one of various polyhedral forms. The optical device 103 can be formed of a material capable of transmitting a laser beam while minimizing optical loss, and for example, the optical device 103 can be formed of fused silica in an amorphous state, fused quartz in an amorphous state, BaF2, CaF2, LiF, or MgF2, which are in a crystalline state.

The optical device 103 can perform alternate movement with respect to one axis (e.g., a Z-axis) that is in a horizontal direction with respect to the substrate 10 on the stage 104. For example, as illustrated in FIGS. 5 through 7, the optical device 103 can rotate in a clockwise direction by a predetermined angle with respect to the one axis (the Z-axis), and from a position shown in FIG. 7 to a position shown in FIG. 5, the optical device 103 can rotate in a counterclockwise direction by a predetermined angle with respect to the one axis (the Z-axis). An angular velocity of the optical device 103 can be constant.

Regarding a laser beam L that is incident to the optical device 103 performing the alternate movement, when the laser beam L is emitted from the optical device 103, a path of the laser beam L is changed according to an incidence angle of the laser beam L and a refractive index of the optical device 103.

When the laser beam L is vertically incident to the optical device 103, when an incidence angle of the laser beam L is 0°, the laser beam L passes through the optical device 103 without refraction and then reaches a top surface of the semiconductor layer 11. Since the incidence angle and an exit angle of the laser beam L passing through the optical device 103 are the same, when the incidence angle of the laser beam L is 0°, the exit angle of the laser beam L that is incident to the optical device 103 and then is emitted from the optical device 103 is also 0°.

When the optical device 103 rotates as in the case of FIG. 5, the laser beam L is incident to the optical device 103 at an incidence angle $\theta_1$, and is refracted in the optical device 103. The optical device 103 is disposed in a vacuum state or in air, and the refractive index of the optical device 103 is greater than a refractive index of the vacuum state or air, so that a refraction angle $\theta_2$ of the laser beam L is less than the incidence angle $\theta_1$ of the laser beam L. When the laser beam L is emitted from the optical device 103, the laser beam L encounters the vacuum state or air having a refractive index less than that of the optical device 103, so that an exit angle $\theta'_1$ of the laser beam L is greater than the refraction angle $\theta_2$ of the laser beam L. In this manner, when the optical device 103 rotates and thus an angle between a surface 103a of the optical device 103 and the laser beam L is 90°−$\theta_1$, a path T of the laser beam L having the incident angle of 0° is changed to a path T' of the laser beam L in a +X axis direction.

So that the laser beam L is repeatedly irradiated to a crystallization region while a path of the laser beam L is changed, the stage 104 is moved by a distance corresponding to the change of the path of the laser beam L. That is, the angular velocity of the optical device 103 and a movement velocity of the stage 104 can be synchronized, and accordingly, if the laser beam L is moved by a predetermined distance $u_1$ in the +X axis direction, the stage 104 can also be moved in the +X axis direction by a distance corresponding to the predetermined distance $u_1$ by which the laser beam L is moved. As described above, since the stage 104 is moved by the same distance the laser beam L is moved, in the cases of FIGS. 5 and 6, the laser beam L emits light to the same region on the substrate 10.

As in the case of FIG. 7, when the optical device 103 performs the alternate movement and thus rotates, the laser beam L is incident to the optical device 103 at an incidence angle $\theta_3$ and is refracted in the optical device 103. A refraction angle $\theta_4$ of the laser beam L is less than the incidence angle $\theta_3$ of the laser beam L, an exit angle $\theta'_3$ of the laser beam L is greater than the refraction angle $\theta_4$ of the laser beam L, and the incidence angle $\theta_3$ and the exit angle $\theta'_3$ of the laser beam L are the same.

FIG. 7 illustrates the case in which the optical device 103 rotates and thus an angle between a surface 103a of the optical device 103 and the laser beam L is 90°+$\theta_3$, and in this case, to a path T of the laser beam L having the incident angle of 0° is changed to a path T" of the laser beam L by a predetermined distance $u_2$ in a −X axis direction.

So that the laser beam L is repeatedly irradiated to a crystallization region while a path of the laser beam L is changed, the stage 104 is moved by a distance corresponding to the change of the path of the laser beam L. That is, if the laser beam L is moved by a predetermined distance $u_2$ in the −X axis direction, the stage 104 is also moved in the −X axis direction by a distance corresponding to the predetermined distance $u_2$ by which the laser beam L is moved. Since the stage 104 is moved by the same distance the laser beam L is moved, in the cases of FIGS. 6 and 7, the laser beam L emits light to the same region on the substrate 10.

As described above, in the channel region 2 (refer to FIG. 3) or the storage region 3 (refer to FIG. 3), which is required to be crystallized, the laser beam L is repeatedly irradiated, so that crystallization is uniformly performed, and it is possible to prevent the occurrence of a boundary line that occurs when the laser beam L partially overlaps with a next laser beam L. Since the laser beam L is not irradiated to the emission region 4 (refer to FIG. 3), the selective crystallization is performed in a manner that the stage 104 is moved by a length of the emission region 4.

Figure 8:
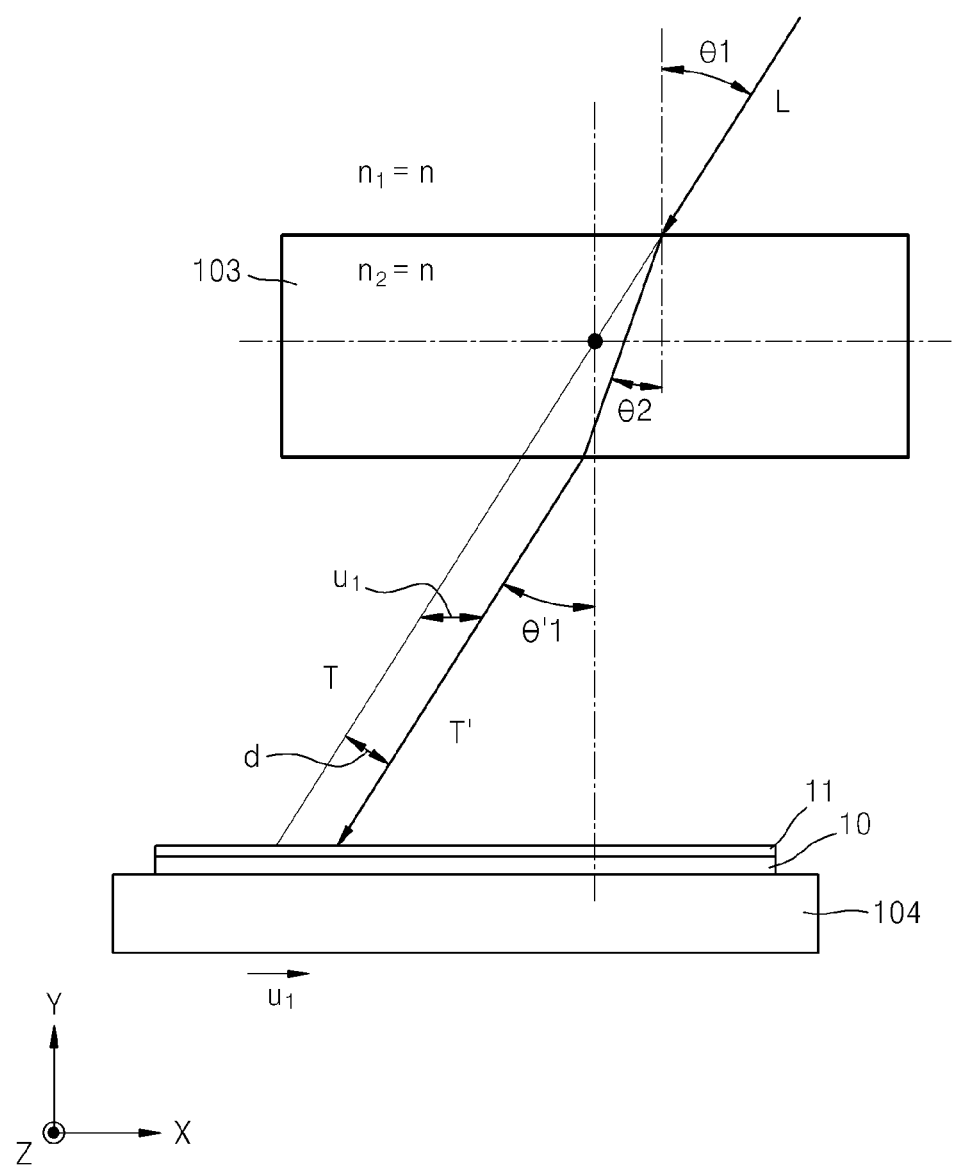
FIG. 8 illustrates the optical device and the stage shown in FIG. 1.

FIG. 8 illustrates a path of a laser beam L when the laser beam L is incident to the optical device 103 at an incidence angle $\theta_1$.

Referring to FIG. 8, as described above with reference to FIG. 5, the laser beam L is incident to the optical device 103 at the incidence angle $\theta_1$, and a refractive index ($n_2$=n) of the optical device 103 is greater than a refractive index ($n_1$=n) of the vacuum state or air, so that a refraction angle $\theta_2$ of the laser beam L is less than the incidence angle $\theta_1$ of the laser beam L. When the laser beam L is emitted from the optical device 103, the laser beam L is emitted to the vacuum state or air, which is a medium having a smaller refractive index than that of the optical device 103, so that an exit angle $\theta'_1$ of the laser beam L is greater than the refraction angle $\theta_2$ of the laser beam L, and the incidence angle $\theta_1$ and the exit angle $\theta'_1$ of the laser beam L are the same. Due to the refraction in the optical device 103, a path T of the laser beam L that does not undergo the refraction due to the optical device 103 is changed to a path T' of the laser beam L by a predetermined distance $u_1$ in a +X axis direction. The predetermined distance $u_1$ will now be obtained in detail. First, a vertical distance d between the two paths T and T' of the laser beam L is calculated by using Equation 1, $$d = t(\tan \theta_1 - \tan \theta_2) \quad \text{[Equation 1]}$$

(where, t is a thickness of the optical device 103).

According to Snell's law regarding incidence and refraction of a laser beam L, Equation 2 is obtained.

$$n_1 \sin \theta_1 = n_2 \sin \theta_2 \quad \text{[Equation 2]}$$

A vertical distance d between the predetermined distance $u_1$ and the two paths T and T' of the laser beam L is calculated by using Equation 3.

$$d = u_1 \cos \theta_1 \quad \text{[Equation 3]}$$

When the predetermined distance $u_1$ is obtained by using Equations 1 through 3, Equation 4 is achieved.

$$x = t \sin \theta_1 \left(1 - \frac{\cos \theta_1}{\sqrt{n^2 - \sin^2 \theta_1}}\right) \quad \text{[Equation 4]}$$

As shown in Equation 4, a movement path of the laser beam L is changed according to the incidence angle $\theta_1$ of the laser beam L. In some embodiments, the stage 104 on which the substrate 10 is arranged is moved so that the laser beam L is repeatedly irradiated to the crystallization region, wherein a path of the laser beam L is changed according to the incidence angle $\theta_1$ of the laser beam L.

A laser beam generated by the laser generating device 101 of the crystallization apparatus 100 can not be a conventional continuous wave laser, or a pulse laser. For example, in the case where the laser generating device 101 generates a pulse laser having a frequency of 6000 Hz, a high frequency laser is irradiated 6000 times to the substrate 10 per second.

When the pulse laser generated by the laser generating device 101 is irradiated once to the semiconductor layer 11, the semiconductor layer 11 in a melting region to which the pulse laser is irradiated is melted and then solidifies, so that polysilicon is formed. Next, the optical device 103 rotates in a pause period between pulses, and thus a next laser beam is incident to the optical device 103 at an incidence angle different from a previous laser beam, so that, as described above, a path of the next laser beam is changed. So that the next laser beam is irradiated to the same region on the substrate 10 as the previous laser beam, the stage 104 is moved during the pause period between pulses. Polysilicon is melted and then solidifies in a region in which the irradiation of the previous laser beam and the irradiation of the next laser beam overlap with each other, so that crystallization is performed. In this manner, by periodically irradiating a laser beam to the optical device 103 that rotates while the stage 104 is moved, channel regions and storage regions in pixels are crystallized. According to some embodiments, so that the pulse laser is irradiated to regions (i.e., the channel region an the storage region) of the semiconductor layer 11, which are required to be crystallized, a pulse period of the pulse laser, the angular velocity of the optical device 103, and the movement velocity of the stage 104 can be synchronized. During the pulse period, the optical device 103 can rotate at a constant velocity and the stage 104 can linearly move at a constant velocity.

The pixels are disposed in rows and columns on the substrate 10, so that, after crystallization of channel regions and storage regions of pixels disposed in one row is complete, the stage 104 is moved so that the laser beam is irradiated to channel regions and storage regions of pixels disposed in a next row.

Figure 9:
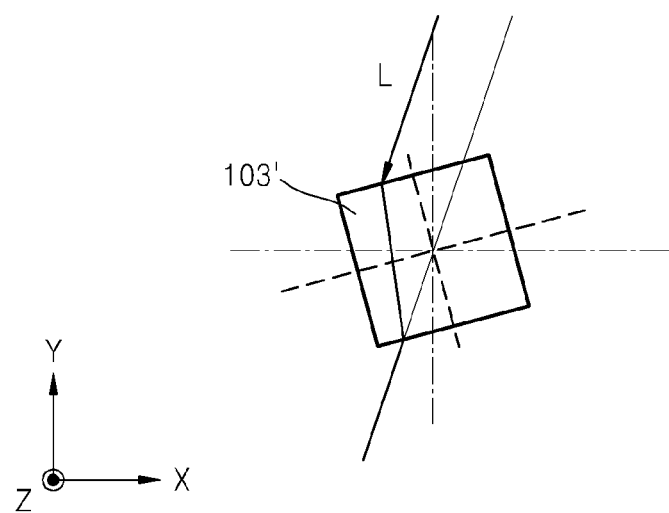
FIG. 9 is a diagram illustrating another embodiment of an optical device.

FIG. 9 is a diagram illustrating another embodiment of an optical device 103'.

Unlike the optical device 103 of FIG. 1, the optical device 103' of FIG. 9 can have a cube form. The optical device 103' having the cube form can rotate with respect to one axis (e.g., a Z-axis) of the optical device 103'. Unlike the optical device 103 of FIG. 1, of which a cross-section has a rectangular form, six faces of the optical device 103' of FIG. 9 have the same area and shape, so that an incidence angle of a laser beam L due to rotation movement varies within a predetermined range.

According to the one or more embodiments of the present invention, it is possible to perform selective crystallization, whereby a use efficiency of a laser can be increased and maintenance costs can be decreased.

While the present invention has been particularly shown and described with reference to certain embodiments thereof, it will be understood by those of ordinary skill in the art that various changes in form and details can be made therein without departing from the spirit and scope of the present invention as defined by the following claims.

What is claimed is:

1. A method of manufacturing an organic light-emitting display apparatus, the method comprising:
    arranging a substrate on a stage, wherein a semiconductor layer is formed on one surface of the substrate;
    irradiating a laser beam through an optical device;
    irradiating the laser beam passing through the optical device to a region of the semiconductor layer to perform crystallization;
    changing the position of the optical device by rotating with respect to a constant axis in order to change a path of the laser beam;
    irradiating the laser beam with the changed path to the semiconductor layer; and
    moving the stage in a direction perpendicular to the constant axis such that the laser beam with the changed path is irradiated to the same region of the semiconductor layer to which the laser beam has been irradiated,
    wherein the change in the path of the laser beam is governed by the equation $$x = t\sin\theta_1\left(1 - \frac{\cos\theta_1}{\sqrt{n^2 - \sin^2\theta_1}}\right),$$

wherein $\theta_1$ represents an incidence angle of the laser beam, t represents a thickness of the optical device, and n represents a refractive index.

2. The method of claim 1, wherein the laser beam is a line beam having a predetermined width.

3. The method of claim 1, wherein an angular velocity of the optical device and a movement velocity of the stage are synchronized with each other.

4. The method of claim 1, wherein an incidence angle of the laser beam that is incident to the optical device is the same as an exit angle of the laser beam that is emitted from the optical device.

5. The method of claim 1, wherein the optical device has a rectangular parallelepiped form.

6. The method of claim 5, wherein the optical device alternately rotates.

7. The method of claim 1, wherein the optical device has a cube form.

8. The method of claim 7, wherein the optical device rotates at a constant velocity.

9. The method of claim 1, wherein the laser beam generated by the laser generator device is a pulse laser.

10. The method of claim 9, wherein an n-th path in which an n-th pulse of the pulse laser is incident to and is emitted from the optical device is different from an n+1-th path in which an n+1-th pulse of the pulse laser is incident to and is emitted from the optical device.

11. The method of claim 10, wherein the stage is moved such that the region on the semiconductor layer to which the n-th pulse reaches is the same as the region on the semiconductor layer to which the n+1-th pulse reaches.

12. The method of claim 1, wherein a pulse period of the pulse laser, an angular velocity of the optical device, and a movement velocity of the stage are synchronized so that the pulse laser is irradiated to regions of the semiconductor layer to be crystallized.

13. The method of claim 1, wherein the optical device is formed of fused silica, fused quartz, BaF2, CaF2, LiF, or MgF2.

14. The method of claim 1,
    wherein the organic light-emitting display apparatus comprises a plurality of pixels having channel regions, storage regions, and emission regions, and
    wherein the region on the semiconductor layer to which the laser beam and the laser beam with the changed path are irradiated comprises only the channel regions and the storage regions of the pixels, and not the emission regions of the pixels.

* * * * *